United States Patent [19]

Sakurai

[11] Patent Number: 4,540,649
[45] Date of Patent: Sep. 10, 1985

[54] WATER DEVELOPABLE PHOTOPOLYMERIZABLE COMPOSITION AND PRINTING PLATE ELEMENT CONTAINING SAME

[75] Inventor: Kiyomi Sakurai, San Diego, Calif.

[73] Assignee: Napp Systems (USA) Inc., San Marcos, Calif.

[21] Appl. No.: 649,905

[22] Filed: Sep. 12, 1984

[51] Int. Cl.$^3$ .............................................. G03C 1/68
[52] U.S. Cl. .................................. 430/270; 430/905; 430/926; 430/909; 430/300; 430/302; 204/159.23; 204/159.24
[58] Field of Search ............... 430/270, 905, 906, 909, 430/300, 302; 204/159.23, 159.24; 526/261

[56] References Cited

U.S. PATENT DOCUMENTS

| | | | |
|---|---|---|---|
| 3,801,328 | 4/1974 | Takimoto et al. | 430/288 |
| 3,899,611 | 8/1975 | Hall | 204/159.23 |
| 4,125,678 | 11/1978 | Stvan et al. | 204/159.23 |
| 4,209,581 | 6/1980 | Takanashi et al. | 430/288 |
| 4,230,550 | 10/1980 | Vincent | 204/159.23 |
| 4,233,391 | 11/1980 | Okay et al. | 430/288 |

*Primary Examiner*—Jack P. Brammer
*Attorney, Agent, or Firm*—Lyon & Lyon

[57] ABSTRACT

A water developable, photopolymerizable composition and printing plates prepared from such composition are disclosed. The photopolymerizable composition includes at least one water soluble polymer, such as polyvinyl alcohol or partially saponified polyvinyl acetate, at least one photopolymerization initiator, and the condensation reaction product of N-methylol acrylamide, N-methylol methacrylamide, N-alkyloxymethyl acrylamide or N-alkyloxymethyl methacrylamide with a melamine derivative of the following formula:

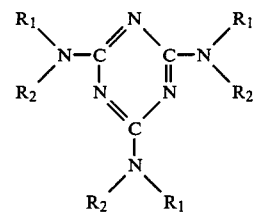

wherein, $R_1$ is $CH_2OR$, $R_2$ is H or $CH_2OR$, and R is $C_1$–$C_4$ alkyl. A thermal polymerization inhibitor may also be included in the composition.

Plates prepared from the composition demonstrate improved hardness and water resistance, compared to previously known photopolymerizable compositions, and also achieve excellent image quality.

13 Claims, No Drawings

WATER DEVELOPABLE PHOTOPOLYMERIZABLE COMPOSITION AND PRINTING PLATE ELEMENT CONTAINING SAME

FIELD OF THE INVENTION

This invention relates generally as indicated to water developable, photopolymerizable compositions and to printing plates prepared from such compositions, which may be directly utilized as printing plates and are also useful for the production of relief images.

BACKGROUND OF THE INVENTION

Photopolymerizable compositions suitable for producing photopolymer printing plates are now well known in the art. In U.S. Pat. No. 3,801,328, the disclosure of which is incorporated by reference, a particularly satisfactory photopolymerizable composition is described. The composition is water developable, which enables printing plates prepared therefrom to be easily developed without incurring the risk and hazards of organic solvents, and yet at the same time produces an image surface sufficiently hard to permit repeated use. The compositions thus described in U.S. Pat. No. 3,801,328 have met with significant commercial success. Nevertheless, such compositions require long exposure times to produce a plate having a photopolymerizable surface capable of retaining a fine line or dot, because the polymerization reaction is inhibited by the influence of oxygen. Additionally, such compositions require some form of pre-exposure conditioning, so that commercially satisfactory relief images can be produced on printing plates employing such compositions.

In general, two techniques have been utilized for pre-exposure conditioning, $CO_2$ conditioning and "bump exposure". $CO_2$ conditioning requires maintaining the photosensitive element or plate in a carbon dioxide atmosphere until immediately prior to the image exposure. The bump exposure technique requires that the photosensitive plate be subjected to a brief light exposure immediately prior to the longer duration image exposure in the presence of a negative. Irrespective of which pre-exposure conditioning technique is utilized, both require special handling which the industry would like to avoid.

In U.S. Pat. No. 4,233,391, the disclosure of which is also incorporated herein by reference, an improved composition is described for eliminating pre-exposure conditioning of the photopolymerizable composition and plates. In the compositions described in this patent, a chemical activator comprising a phosphine derivative is included. While the resulting composition eliminates pre-exposure conditioning utilizing either the carbon dioxide or the bump exposure technique, it has been found that the photosensitivity of the coated plates decreases gradually during storage, due to the instability of the phosphine activators in the presence of oxygen. Moreover, the phosphine activators have also been found to be somewhat thermally unstable. As a consequence, it is difficult to control the quality of the images resulting from the use of such plates over a period of time.

Another composition which has been proposed to enable elimination of pre-exposure conditioning is described in U.S. Pat. No. 4,209,581, the disclosure of which is also incorporated herein by reference. According to that patent, a composition is formed from a water soluble resin, a photo initiator, and a condensation reaction product of an alkylol or alkylated alkylol derivative of urea or thiourea with an N-alkylol acrylamide or N-alkylol methacrylamide in the presence of an acid or ammonium salt. Such compositions provide printing plates with excellent sensitivity as well as a shortened developing time. However, the overall quality of the plate is not satisfactory because an excessively long exposure time is required for newspaper publishers to make printing plates from the compositions. Also, while the water resistance and hardness are generally satisfactory, additional improvement in both such features is also quite desirable.

SUMMARY OF THE INVENTION

In the present invention, a water developable photopolymerizable composition is provided which addresses and overcomes the problems of previously known such compositions discussed above. Thus, the composition of the present invention eliminates the need for pre-exposure conditioning and at the same time is chemically and thermally stable and provides printing plates of improved overall quality.

The composition is thus comprised of at least one water soluble polymer, a photopolymerization initiator and a condensation reaction product of N-methylol acrylamide, N-methylol methacrylamide, N-alkyloxymethyl acrylamide or N-alkyloxymethyl methacrylamide and a melamine derivative of the following formula:

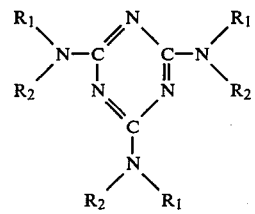

wherein, $R_1$ is $CH_2OR$, $R_2$ is H or $CH_2OR$ and R is $C_1$-$C_4$ alkyl.

DETAILED DESCRIPTION OF THE INVENTION

As set forth above, the photopolymer composition of this invention includes as one component at least one water soluble polymer. The polymer may be any of a number of such materials previously known and utilized in photopolymer compositions, as for example, polyvinyl alcohol, partially saponified polyvinyl acetate, hydroxyalkylcelluose and derivatives thereof, polyvinyl pyrrolidone, polyacrylamide, polyethylene oxide, copolymers of acryl acid, copolymers of maleic acid or maleic anhydrous, and water soluble polyamide derivatives. Preferred such materials are polyvinyl alcohol or a partially saponified polyvinyl acetate, preferably having an average degree of polymerization of about 300 to 2000 and a saponification degree of about 65 to 99 mole percent. Saponification, as used here, is intended to mean the conversion of ester groups or the like into alcohol groups, and the degree of saponification represents the extent to which ester groups have been converted to alcohol or hydroxy groups.

The hardness of the photopolymerizable composition coated on the surface of the resulting printing plate, as well as the speed of washing during the developing procedure, depend directly on the degree of saponification. Thus, when saponified polyvinyl acetate is utilized as the water soluble polymer or as one of such polymers, it is preferable that it have a degree of saponification within the expressed range. In some cases however, as will be understood by those skilled in the art, where a certain degree of saponification is necessary for compatibility with other components of the photopolymerizable composition, the required degree of saponification of polyvinyl acetate may be obtained by mixing two or more partially saponified polyvinyl acetate polymers with different degrees of saponification to provide a mixture of two or more polymers to obtain the desired average saponification degree for any given monomer component.

The photopolymerization initiator may also be any of a number of such components previously known and used. Thus, the initiator may be an acetophenone, benzophenone or benzoin derivative such as methyl, ethyl, isopropyl, isobutyl, octyl, vinyl, aryl and allyl ethers of benzoin, e.g., benzoin methyl ether, benzoin ethyl ether, benzoin isopropyl ether, benzoin vinyl ether, benzoin allyl ether, etc. Benzophenone derivatives suitable for use in the present invention include benzophenone, 2-methyl benzophenone, 2-methoxybenzophenone, 2,2-dimethoxybenzophenone, and the like. Suitable acetophenone derivatives include 2,2-dimethoxy-2-phenylacetophenone, 2,2-diethoxy-2-phenyl acetophenone, 2,2-diisopropoxy-2-phenylacetophenone, and 2,2-di-n-butoxy-2-phenylacotephenone.

Suitable N-alkyloxymethyl acrylamides and N-alkyloxymethyl methacrylamides include as the alkyl substituent, methyl, ethyl, propyl, butyl, and isobutyl. Illustrative of catalysts suitable for the condensation reaction of such acrylamides or methacrylamides with the melamine derivatives are, for example, inorganic acids such as hydrochloric acid, sulfuric acid and phosphoric acid, organic acids such formic acid, oxalic acid and tartaric acid, p-toluenesulfonic acid and sulfamic acid, as well as ammonium salts thereof.

Melamine derivatives suitable for reaction with the described N-acrylamides and methacrylamides are of the following general formula:

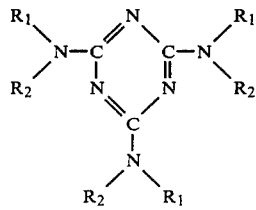

wherein, $R_1$ is $CH_2OR$, $R_2$ is H or $CH_2OR$ and R is $C_1$-$C_4$ alkyl. Such compounds are available commercially from Monsanto Chemical Company under the tradename Resimene, specifically Resimene 717, Resimene 745, and Resimene 753.

The photopolymerizable compositions may also include a thermal polymerization inhibitor such as a phenol derivative as, for example, p-methoxyphenol, hydroquinone derivatives, benzoquinone derivatives, a copper compound and a nitroso compound.

The composition will typically include about 20 to about 95% by weight, based on the total weight of the composition, of at least one of the indicated water soluble polymers and from about 5 to about 75 weight percent of the condensation reaction product. Preferred quantities of such ingredients are from 40 to about 90 percent by weight of the polymer and from about 10 to about 60 weight percent of the condensation reaction product. The polymerization initiator will typically be used in a quantity of from about 0.001 weight percent to about 10 weight percent, preferably not more than about 7 weight percent. When a thermal inhibitor is used, it will ordinarily be used in quantity of from about 0.001% to about 1.0%, preferably from about 0.005 to about 0.5 weight percent, based on the weight of the condensation reaction product.

The process of the present invention is preferably carried out by dissolving the melamine derivative and the N-methylol acrylamide, N-methylol methacrylamide, N-alkyloxymethyl acrylamide or N-alkyloxymethyl methacrylamide in water or in an organic solvent, together with the acid catalyst for the condensation reaction. If a thermal polymerization inhibitor is utilized, it will also be added to the mixture, and the mixture will then be heated at a temperature of approximately 50° to 80° C. for about 1 to about 10 hours, with stirring. The proportion of the melamine derivative to the N-methylol acrylamide, N-methylol methacrylamide, N-alkyloxymethyl acrylamide or N-alkyloxymethyl methacrylamide will preferably be about one mol of the melamine derivative to about three to six mols of the N-methylol acrylamide, N-methylol methacrylamide, N-alkyloxymethyl acrylamide or N-alkyloxymethyl methacrylamide acrylamide or the methacrylamide.

After processing as described above, the condensation reaction product is added to a water mixture of the water soluble polymer component to which the photopolymerization intiator is also added and aggitated for a period of time, ranging between approximately 0.1 and 1 hour to give a photopolymerizable composition. The composition is thereafter coated on an appropriate substrate and dried to provide the photopolymer printing plate.

The substrate for the printing plate may be either metallic and/or plastic. Preferred substrates are aluminum and tin plates. The substrate may be treated either chemically or physically prior to coating with the photopolymerizable material to insure adequate adhesion with the photopolymerizable composition. Roughening or grating of the substrate surface eliminates the need for a separate adhesive layer, although such a layer may be utilized if desired in certain instances.

The photopolymerizable composition may be cast directly on the substrate. Small amounts of dyestuffs may be added to the photopolymerizable composition to provide antihalation properties. Generally, sufficient amounts are added to the composition just below that at which the composition becomes hazy. Examples of effective dyestuffs are rose bengal, eosine, methylene blue, and malachite green. Such dyestuffs may be used solely or in combination, at a ratio from about 1 to about 100 ppm, based on the amount of the photopolymerizable composition.

After the plate has been coated with the photopolymerizable composition, the plate may be exposed to a source of actinic light to effect imagewise exposure. The composition of the present invention is sufficiently light sensitive to enable exposure to occur by use of diffusion light sources such as chemical lamps, which give off actinic light with wavelengths in the desired range of about 300 to 400 nanometers.

It should also be understood that printing plates having varying degrees of photopolymer thickness can utilize the photopolymerizable compositions of the present invention, including relief plates having photopolymer thicknesses greater than 0.02 inches and shallow relief plates having photopolymer layers ranging between 0.004 and 0.02 inches in thickness. When shallow relief plates are desired, a binder composition is typically interposed between the substrate and the photopolymer layer. The binder composition will contain dispersed therein particles in a size and concentration sufficient to create a plurality of protuberances in the background area of the photosensitive element after its exposure and development to create a relief image. Useful binders include polyesters, polyurethanes, polyethylene butadiene copolymers, polyvinyl acetate derivatives, polyamides, epoxy resins, styrenebutadiene copolymers, mixtures of such copolymers and partially hydrolyzed polyvinyl acetate, unsaturated polyesters prepared, for example, from diethylene glycol, maleic anhydride and phthalic anhydride, mixtures of such polyesters and partially hydrolyzed polyvinyl acetate, and mixtures of glyoxal and partially hydrolyzed polyvinyl acetate. Dispersed particles suitable for use in such plates include color pigments. Particle size and concentration, of course, are selected for any given situation, depending upon the printing parameters such as the thickness of the relief image, printing pressures, number of repetitions, etc.

The invention will be better understood by reference to the following specific but illustrative examples.

EXAMPLE 1

1 part by weight of ammonium chloride and 0.2 part by weight of p-methoxyphenol were dissolved in 30 parts by weight of water. 130 parts by weight of hexamethoxymethyl melamine (Resimene 745 purchased from Monsanto Chemical Company) and 202 parts by weight of N-methylol acrylamide were added into this solution, and stirred at 60° C. for two hours. The solution was cloudy at first, then gradually turned to clear.

100 parts by weight of polyvinyl alcohol with a polymerization degree of 500 and a saponification value of 82 mol % was put into 100 parts by weight of water and agitated at 90° C. for half an hour. To this mixture, 100 parts by weight of the above-mentioned condensate product and 3 parts by weight of 2,2-dimethoxy-2-phenyl acetophenone were added and agitated for half an hour to give a photopolymerizable composition.

The photopolymerizable composition thus prepared was coated on an aluminum substrate with an anti-halation layer and dried at 80° C. for 50 minutes, whereby a photopolymer printing plate with 0.5 mm in thickness of photopolymerizable layer was obtained.

The photopolymer plate was placed in a vacuum frame and the surface of the plate was brought into contact with a test negative. It was exposed to a chemical lamp (Sylvania 350 BL) for 20 seconds from a distance of 2 inches. After exposure, the negative was stripped from the plate and the unexposed polymer was removed by spray washing with water under a pressure of 40 psi for 2½ minutes. Water temperature was 120° F. After that, the printing plate was dried at 230° F. for 3 minutes. The printing plate thus prepared showed excellent image that 2% highlight dots of halftone and isolated line with 40u width remained, without any damage.

EXAMPLE 2

1 part by weight of ammonium chloride and 0.2 part by weight of p-methoxyphenol were dissolved in 30 parts by weight of water. 172 parts by weight of trimethoxymethyl tributoxymethyl melamine (Resimene 753 from Monsanto Chemical Company) and 202 parts by weight of N-methylol acrylamide were added into this solution, and stirred at 60° C. for 2 hours.

100 parts by weight of polyvinyl alcohol with a polymerization degree of 500 and a saponification value of 80 mol % was put into 80 parts by weight of water and stirred at 90° C. for half an hour. To this dissolved solution, 60 parts by weight of above-mentioned condesate product and 3.5 parts by weight of benzoin isopropyl ether were added and agitated for half an hour to give a photopolymerizable composition.

The photopolymerizable composition thus prepared was coated on the aluminum substrate with an antihalation layer and dried at 80° C. for 40 minutes, whereby a photopolymer printing plate with 0.5 mm in thickness of photopolymerizable layer was obtained.

The photopolymer plate was placed in a vacuum frame and the surface of the plate was brought into contact with a test negative. It was exposed to a chemical lamp (Sylvania 350 BL) for 30 seconds from a distance of 2 inches. After exposure, the negative was stripped from the plate and the unexposed polymer was removed by spray washing with water under the pressure of 40 psi and temperatue of 120° F. for 3 minutes. After that, the printing plate was dried at 230° F. for 3 minutes. The printing plate thus prepared showed excellent image that 2% highlight dots of halftone and isolated line with 40u width were retained without damage.

EXAMPLE 3

202 parts by weight of trimethoxymethyl melamine (Resimene 717 from Monsanto Chemical Company, solid content 85%) was used instead of 130 parts of hexamethoxymethyl melamine of Example 1 in the same manner as described in Example 1, and the condensate product was obtained.

The following formulation was applied in the same manner as described in Example 1 and the same result was obtained.
polyvinyl alcohol (p=500, S.V.=80.0 mol %) ... 100 parts
water ... 80 parts
condensation product described above ... 100 parts
dimethylaminopropyl acrylamide ... 2 parts
2,2-dimethoxy-2-phenyl acetophenone ... 3 parts

EXAMPLE 4

To compare the plate performance of Example 1 with a plate which was made according to U.S. Pat. Nos. 3,801,328, the plate was prepared according to the following formulation.
polyvinyl alcohol (p=500, S.V.=80.5%) ... 70 parts
polyvinyl alcohol (p=500, S.V.=88.5 mol %) ... 30 parts
D.I. water ... 80 parts
B-hydroxyethyl methacrylate ... 100 parts
trimethylol propane trimethacrylate ... 8 parts
2,2-dimethoxy-2-phenyl acetophenone ... 3 parts The plate of Example 1 of this invention and the plate of U.S. Pat. No. 3,801,328 were processed, using the same test negative. Table 1 demonstrates the comparison in quality between the photopolymer printing plate of Example 1 and the plate of U.S. Pat. No. 3,801,328.

TABLE 1

|  | Example 1 |  | U.S. Pat. No. 3,801,328 |  |
| --- | --- | --- | --- | --- |
| Exposure time time* | 20" | 30" | 40" | 60" |
| Remaining of half tone |  |  |  |  |
| 2% | 0 | 0 | x | x |
| 3% | 0 | 0 | x | x |
| 5% | 0 | 0 | x | 0 |
| 10% | 0 | 0 | 0 | 0 |
| Min. finest line width | 40u | 30u | 60u | 50u |
| Dot depth of 90% shadow | 30u | 25u | plug | plug |
| Gray Step** | 15 | 16 | 14 | 16 |
| Shoulder Angle | 60° | 59° | 80° | 78° |

*Exposure unit: chemical lamp without bump exposure
**Kodak photographic step tablet #2
0 = Halftone Dots Remaining
x = Halftone Dots Not Remaining As shown in Table 1, the photopolymer printing plate made with the photopolymerizable composition of the present invention has higher sensitivity than the plate of U.S. Pat. No. 3,801,328. The plate from U.S. Pat. No. 3,801,328 had poor remaining highlight dot with even twice the exposure time of the plate of this invention.

EXAMPLE 5

To compare the condensation reaction product of hexamethoxy methyl melamine and N-methylol acrylamide with the condensation resultant of urea-formaldehyde resin and N-methylol acrylamide, the following two samples were prepared.
Sample 1
Condensation product of Example 1 ... 10 g
Benzoin isopropyl ether ... 0.3 g
Sample 2
Condensation product made in the same manner as Example 1, except using 110 parts by weight of urea-formaldehyde resin (Beetle 50 from American Cyanamide Company) instead of 130 parts of hexamethoxy melamine ... 10 g
benzoin isopropyl ether ... 0.3 g
Both samples were put into small aluminum dishes and were exposed to UV light for 30 seconds. After exposure, cured polymer was taken off and hot water resistance was measured. Table II shows the comparison of decreasing hardness and increasing weight ratio by soaking in 60° C. of water.

TABLE II

|  | Sample 1 |  | Sample 2 |  |
| --- | --- | --- | --- | --- |
|  | hardness* | wt. increasing | hardness* | wt. increasing |
| Beginning | 95 | — | 78 | — |
| 10' soaking | 94 | 2.2% | 45 | 5.9% |
| 30' soaking | 90 | 4.2% | 10 | 11.6% |
| 60' soaking | 84 | 7.5% | swelling | 15.6% |

*hardness: Barber Coleman 935

As shown in Table II, the melamine derivative modified with N-methylol acrylamide gave higher hardness and excellent hot-water resistance than the urea-modified with N-methylol acrylamide. This result demonstrates that photopolymer plates of the condensation product of hexamethoxyl methyl melamine and N-methylol acrylamide give excellent image quality.

It will thus be appreciated that the photopolymerizable composition of this invention, utilizing the described melamine derivative, has overcome the problems associated with previously known compositions, particularly the urea-formaldehyde compositions of U.S. Pat. No. 4,209,581, and possesses the requisite outstanding properties of hardness, durability and stability. However, it should be noted that to achieve the necessary compatibility with the water soluble polymer and also to achieve the described properties, the melamine derivative will be of the formula indicated.

It, of course, should be understood that various changes and modifications to the preferred embodiments described herein will be apparent to those skilled in the art. Such changes and modifications can be made without departing from the spirit and scope of the present invention and without diminishing its attendant advantages. It is, therefore, intended that such changes and modifications be covered by the following claims.

What is claimed is:

1. A water developable, photopolymerizable composition, comprising about 20 to about 95% by weight, based on the total weight of the composition, of at least one water soluble polymer; about 5 to about 75 weight percent of the condensation reaction product of N-methylol acrylamide, N-methylol methacrylamide, N-alkyloxymethyl acrylamide or N-alkyloxymethyl methacrylamide and a melamine derivative of the following formula:

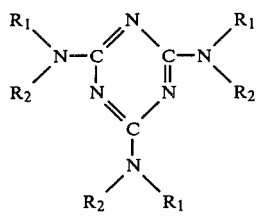

wherein, $R_1$ is $CH_2OR$, $R_2$ is H or $CH_2OR$, and R is $C_1$–$C_4$ alkyl; and at least one photopolymerization initiator.

2. The photopolymerizable composition of claim 1, wherein said condensation reaction product is the reaction product of one mol of said melamine derivative and from three to six mols of said N-methylol acrylamide, N-methylol methacrylamide, N-alkyloxymethyl acrylamide or N-alkyloxymethyl methacrylamide.

3. The photopolymerizable composition of claim 1 or 2, wherein the alkyl substituent of said N-alkyloxymethyl acrylamide or N-alkyloxymethyl methacrylamide is methyl, ethyl, propyl, butyl or isobutyl.

4. The photopolymerizable composition of claim 1, 2 or 3, wherein said water soluble polymer is at least one member of the group consisting of polyvinyl alcohol, partially saponified polyvinyl acetate, hydroxyalkylcelluouse and derivatives thereof, polyvinyl pyrrolidone, polyacrylamide, polyethylene oxide, copolymers of acrylacid, copolymers of maleic acid or maleic anhydrous, and water soluble polyamide derivatives.

5. The photopolymerizable composition of claim 1 or 4, in which said photopolymerization initiator is present in an amount from 0.001 to about 10 weight percent, based on the weight of the condensation reaction product.

6. The photopolymerizable composition of claim 5 or 6, in which said photopolymerization initiator is an acetophenone, benzophenone or benzoin derivative.

7. The photopolymerizable composition of claim 1, in which a thermal polymerization inhibitor is also present.

8. The photopolymerizable composition of claim 1, 2, 3, 4 or 5 in which the composition comprises about 40 to about 90 weight percent of said water soluble polymer and from about 10 to about 60 weight percent of said condensation reaction product.

9. A water developable, photopolymer printing plate which comprises a support material and a layer of water soluble photosensitive resin composition disposed thereon, said composition comprising from about 20 to about 95 weight percent, based on the total of said composition, of at least one water soluble polymer; about 5 to about 75 weight percent of a condensation reaction product of N-methylol acrylamide, N-methylol methacrylamide, N-alkyloxymethyl acrylamide or N-alkyloxymethyl methacrylamide and a melamine derivative of the following formula:

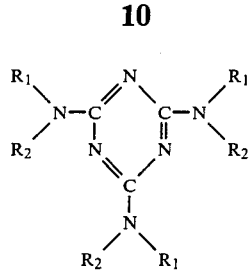

wherein, $R_1$ is $CH_2OR$, $R_2$ is H or $CH_2OR$, and R is $C_1$–$C_4$ alkyl; and at least one photopolymerization initiator.

10. The photopolymer printing plate of claim 9, in which said composition further comprises a thermal polymerization inhibitor.

11. The photopolymer printing plate of claim 9 or 10, in which said water soluble polymer is one or more of the group consisting of polyvinyl alcohol, partially saponified polyvinyl acetate, hydroxyalkylcelluouse and derivatives thereof, polyvinyl pyrrolidone, polyacrylamide, polyethylene oxide, copolymers of acrylacid, copolymers of maleic acid or maleic anhydrous and water soluble polyamide derivatives.

12. The photopolymer printing plate of claim 9, 10 or 11 in which said condensation reaction product of said composition comprises the condensation reaction product of one mol of said melamine derivative and about three to about six mols of said N-methylol acrylamide, N-methylol methacrylamide, N-alkyloxymethyl acrylamide or N-alkyloxymethyl methacrylamide.

13. The photopolymer printing plate of claim 9, 10, 11 or 12, in which said the alkyl substituent of said N-alkyloxymethyl acrylamide or N-alkyoxymethyl methacrylamide is methyl, ethyl, propyl, butyl, or isobutyl.

* * * * *